United States Patent
Yim et al.

(10) Patent No.: US 7,081,675 B2
(45) Date of Patent: Jul. 25, 2006

(54) MULTILAYERED ANISOTROPIC CONDUCTIVE ADHESIVE FOR FINE PITCH

(75) Inventors: Myung Jin Yim, Daejeon (KR); Jun Sang Hwang, Daejeon (KR)

(73) Assignee: Telephus Inc., Daejeon (KR)

( * ) Notice: Subject to any disclaimer, the term of this patent is extended or adjusted under 35 U.S.C. 154(b) by 142 days.

(21) Appl. No.: 10/918,407

(22) Filed: Aug. 16, 2004

(65) Prior Publication Data

US 2006/0033213 A1 Feb. 16, 2006

(51) Int. Cl.
*H01L 23/48* (2006.01)
(52) U.S. Cl. ............ 257/753; 257/783; 428/1.5; 349/122
(58) Field of Classification Search ........ 257/753, 257/783; 428/1.5; 349/122
See application file for complete search history.

(56) References Cited

U.S. PATENT DOCUMENTS

| | | | | |
|---|---|---|---|---|
| 6,238,597 B1* | 5/2001 | Yim et al. | ......... | 252/512 |
| 6,362,090 B1* | 3/2002 | Paik et al. | ......... | 438/614 |
| 6,518,097 B1* | 2/2003 | Yim et al. | ......... | 438/119 |
| 6,878,435 B1* | 4/2005 | Paik et al. | ......... | 428/215 |
| 2003/0008133 A1* | 1/2003 | Paik et al. | ......... | 428/332 |
| 2006/0033213 A1* | 2/2006 | Yim et al. | ......... | 257/753 |
| 2006/0035036 A1* | 2/2006 | Yim et al. | ......... | 428/1.1 |

* cited by examiner

*Primary Examiner*—Mark V. Prenty
(74) *Attorney, Agent, or Firm*—Rothwell, Figg, Ernst & Manbeck, P.C.

(57) ABSTRACT

Provided is an anisotropic conductive adhesive for a fine pitch having a conductive adhesive layer and a nonconductive adhesive layer formed on one surface or both surfaces of the conductive adhesive layer. The anisotropic conductive adhesive for a fine pitch can be used to adhere an integrated circuit, on which a plurality of bumps each having a second height are formed, to a substrate, on which a plurality of electrodes each having a first height are formed keeping predetermined distances from each other, so that the integrated circuit is electrically connected to the electrodes. The anisotropic conductive adhesive includes a nonconductive first adhesive layer and a second adhesive layer. The nonconductive first adhesive layer includes a thermosetting resin and a hardener for hardening the thermosetting resin and has a first thickness of ½–⅔ of the second height. The second adhesive layer includes a thermosetting resin, a hardener for hardening the thermosetting resin, and a plurality of conductive particles each having an average particle diameter of ½ or less of the width of gaps between the plurality of electrodes and a first density dispersion, has a second thickness larger than two times the average particle diameter of the conductive particles, and is formed on one surface of the nonconductive first adhesive layer.

11 Claims, 11 Drawing Sheets

MULTILAYERED ANISOTROPIC CONDUCTIVE ADHESIVE FOR FINE PITCH

BACKGROUND OF THE INVENTION

1. Field of the Invention

The present invention relates to an anisotropic conductive adhesive, and more particularly, to an anisotropic conductive adhesive which is used to connect a drive integrated circuit (IC) to a substrate on which electrodes are formed to a fine pitch.

2. Description of the Related Art

Methods of mounting a drive IC on a liquid crystal display (LCD) panel can be classified into a wire-bonding method, a tape automated bonding (TAB) method, a chip-on-glass (COG) method, and the like. In the wire-bonding method, a drive IC is bonded to electrodes on a LCD panel via conductive wires. In the TAB method, a drive IC is mounted on electrodes on a LCD panel using a base film. In the COG method, a drive IC is mounted directly on a LCD panel using a predetermined adhesive. Among theses methods, the COG method has advantages in that an area for mounting a drive IC over a LCD panel can be minimized and the costs for mounting the drive IC over the LCD panel can also be minimized. Thus, the field of use of the COG method can extend. In general, when a drive IC is connected to a LCD panel by the COG method, an anisotropic conductive adhesive is used to electrically connect electrodes of the drive IC to electrodes on the LCD panel.

Currently, LCD panels tend to be large in size and electrodes tend to be fine in order to satisfy the need for storing a large capacity of display information, displaying high-quality information, and so forth. Due to this, the width and thickness of a signal line on the LCD decreases, and a pitch or a gap between electrodes becomes reduced with a reduction in the area of the electrodes or bumps for electrically connecting the drive IC to the LCD panel. In practice, the pitch between the bumps or the electrodes mounted on a PC monitor or a portable telephone screen using the COG method is about 100 μm, and a gap between electrodes is about 50 μm. However, the widths of pitch and the gap is becoming gradually reduced.

Accordingly, an anisotropic conductive adhesive, which is capable of maintaining an adhesion state between a LCD panel and a drive IC with a stronger adhesive strength as well as electrically connecting a larger number of electrodes in a limited space, is required.

However, a prior art anisotropic conductive adhesive is limited in connecting a drive IC to a substrate, on which electrodes are formed to a fine pitch. In other words, when a drive IC is connected to a substrate, on which electrodes are formed to a fine pitch, using the prior art anisotropic conductive adhesive by the COG method or a chip-on-film (COF) method, a short-circuit may easily occur between adjacent bumps or adjacent electrodes due to a gap between the adjacent bumps or the adjacent electrodes. The reason is why a resin constituting an anisotropic conductive adhesive has flowability due to heat applied in an adhesion process using the anisotropic conductive adhesive, conductive particles contained in the anisotropic conductive adhesive flow into gaps between adjacent bumps or adjacent electrodes, and the adjacent bumps or the adjacent electrodes are short-circuited by the conductive particles.

FIGS. 1A and 1B are cross-sectional views explaining a process of connecting a drive IC 20 to a flexible substrate 10 made of polyimide by a COF packaging method using an anisotropic conductive adhesive according to the prior art.

Here, FIG. 1A shows the state before an adhesion process and FIG. 1B shows the state after the adhesion process.

Referring to FIGS. 1A and 1B, electrodes 12, which are formed on the substrate 10 of a metal such as Cu or Al, and bumps 22 on the drive IC 20 each have a width $W_B$ of about 28 μm and are each formed to a pitch P of about 38 μm. Thus, gaps, each having a width $W_G$ of about 10 μm, are formed between the electrodes 12 and between the bumps 22. Also, each of the electrodes 12 are formed on the substrate 10 to a height $H_E$ of about 15 μm while each of the bumps 22 are formed on an Al electrode (not shown) of the drive IC 20 to a height $H_B$ of about 20 μm.

In a process of adhering the drive IC 20 to the substrate 10, a resin and conductive particles 32 of an anisotropic conductive adhesive 30 between the bumps 22 and the electrodes 12 are supplied with heat and pressure. During this process, the viscosity of the anisotropic conductive adhesive 30 becomes lower, and the resin and conductive particles 32 flow into the gaps between the bumps 22 or between the electrodes 12. As a result, as shown in FIG. 1B, after the adhesion process, the number of conductive particles 32 between the bumps 22 and the electrodes 12 is on average smaller than the number of conductive particles 32 in the gaps between the bumps 22 or the gaps between the electrodes 12. Thus, it is impossible to keep the resistance between the electrodes 12 and the bumps 22 low, and the conductive particles 32 are electrically connected to each other between the bumps 22 or between the electrodes 12, thereby increasing the risk of short-circuits occurring. Here, the larger the conductive particles 32 and the higher the number of conductive particles 32, the greater the possibility of short-circuits occurring.

After bonding using an anisotropic conductive adhesive, the conductive particles contribute to the connection between bumps and electrodes in order to obtain proper electrical conductivity between the bumps and the electrodes. For this, a sufficient number of conductive particles need to be contained in the anisotropic conductive adhesive. However, if too many conductive particles are in the anisotropic conductive adhesive, the electrical resistance may be lowered and the possibility of short-circuits occurring becomes higher. In contrast, if there are too few conductive particles, the number of conductive particles contributing to the electrical connection between electrodes is reduced, which may result in an increase in the resistance between the electrodes. This phenomenon occurs because conductive particles, which have to be on the electrodes during the adhesion process, flow into gaps between adjacent bumps or adjacent electrodes. Thus, if the anisotropic conductive adhesive contains more than the proper number of conductive particles, a short-circuiting risk is increased, manufacturing costs are increased, and an excess of conductive particles exists in the gaps between the bumps or the electrodes. As a result, the adhesive strength of the anisotropic conductive adhesive deteriorates. In order to prevent the conductive particles from flowing into the gaps between the bumps or the electrodes, a method of increasing the viscosity of the anisotropic conductive adhesive can be considered. However, in such a method, smooth adhesion cannot be achieved and voids are formed in the gaps, thereby deteriorating the mechanical strength of the anisotropic conductive adhesive as well as the adhesive strength.

SUMMARY OF THE INVENTION

The present invention provides an anisotropic conductive adhesive for a fine pitch which is capable of stably and reliably connecting a drive IC to a substrate having fine electrodes by using a chip-on-glass (COG) or a chip-on-film (COF) packaging method preventing conductive particles from flowing into gaps between bumps or electrodes and reducing costs.

According to an aspect of the present invention, there is provided an anisotropic conductive adhesive for a fine pitch which can be used to adhere an integrated circuit, on which a plurality of bumps each having a second height are formed, to a substrate, on which a plurality of electrodes each having a first height are formed keeping predetermined distances from each other, so that the integrated circuit is electrically connected to the electrodes. The anisotropic conductive adhesive includes a nonconductive first adhesive layer and a second adhesive layer that is formed on one surface of the nonconductive first adhesive layer. The nonconductive first adhesive layer includes a thermosetting resin and a hardener for hardening the thermosetting resin and has a first thickness of $1/2-3/2$ of the second height. The second adhesive layer includes a thermosetting resin, a hardener for hardening the thermosetting resin, and a plurality of conductive particles each having an average particle diameter of $1/2$ or less of the width of gaps between the plurality of electrodes and a first density dispersion, has a second thickness larger than two times the average particle diameter of the conductive particles.

Preferably, the conductive particles are contained at the first density dispersion of 20–50 thousand/mm².

The second adhesive layer may further include a plurality of nonconductive particles, each having an average particle diameter of $1/2-1/10$ of the average particle diameter of the conductive particles, which are contained at a second density dispersion which is higher than the first density dispersion. It is preferable that the second density dispersion is 2–6 times higher than the first density dispersion.

The first thickness of the nonconductive first adhesive layer is equal to or greater than the second thickness of the second adhesive layer.

The substrate is a glass substrate having indium tin oxide electrodes or a flexible film having metal electrodes.

The anisotropic conductive adhesive may further include a third nonconductive adhesive layer which is formed the other surface of the second adhesive layer opposite to a surface of the second adhesive layer on which the nonconductive first adhesive layer is formed. The third nonconductive adhesive layer includes a thermosetting resin and a hardener for hardening the thermosetting resin. It is preferable that the third adhesive layer has a third thickness of $1/2-3/2$ of the first height of the electrodes formed on the substrate. The third thickness is less than the first thickness.

Accordingly, in case where an IC is connected to a substrate, on which a plurality of electrodes are formed to a fine pitch, using an anisotropic conductive adhesive according to the present invention, the number of conductive particles in the anisotropic conductive adhesive flowing into the gaps between the bumps or the electrodes is reduced. Thus, the conductive particles can fully contribute to the electrical connection between the electrodes and the bumps, thereby obtaining stable electrical conductivity. Also, the adhesive strength between the substrate and the IC can be increased more and the costs for completing the anisotropic conductive adhesive can be reduced.

BRIEF DESCRIPTION OF THE DRAWINGS

The above and other features and advantages of the present invention will become more apparent by describing in detail exemplary embodiments thereof with reference to the attached drawings in which:

FIG. 1A shows the state before the adhesion process, and FIG. 1B shows the state after the adhesion process;

DETAILED DESCRIPTION OF THE INVENTION

Figure 1A:
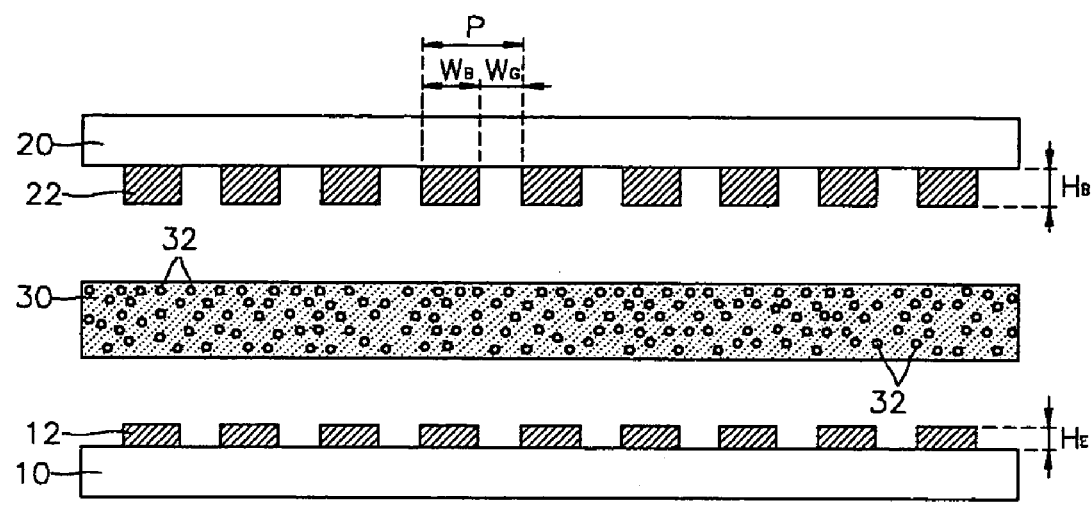
FIGS. 1A and 1B are cross-sectional views explaining a process of connecting a drive IC to a substrate using an anisotropic conductive adhesive according to the prior art, where
Figure 1B:
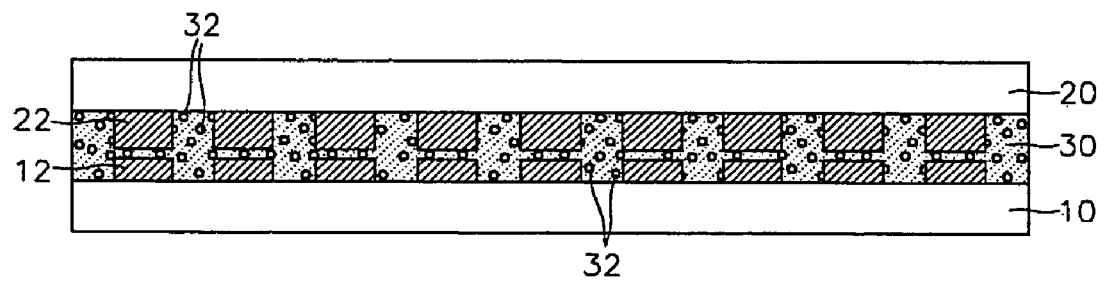

An anisotropic conductive adhesive according to the present invention is used to connect a drive integrated circuit (IC) to a substrate which is made of glass or a flexible film and on which a plurality of electrodes are formed to a fine pitch and are spaced apart from each other so that the drive IC is electrically connected to the plurality of electrodes. The anisotropic conductive adhesive according to the present invention provides a sufficient adhesive strength so as to stably maintain a reliable connection of the drive IC to the substrate. Also, the anisotropic conductive adhesive has a multilayered structure including a conductive adhesive layer that contains conductive particles and a nonconductive adhesive layer that covers at least one surface of the conductive adhesive layer and does not contain conductive particles, in order to prevent conductive particles from flowing into gaps between bumps or electrodes.

The anisotropic conductive adhesive according to the present invention basically contains a thermosetting resin and a hardener for hardening the thermosetting resin. In addition, the conductive adhesive layer of the anisotropic conductive adhesive contains microsized conductive particles each having an average particle diameter of $1/2$ or less of a width of each of gaps between the plurality of electrodes, preferably $1/3$ or less, in order to reliably transmit and receive electrical signals between the bumps on the drive IC and the electrodes on the substrate due to a lowered resistance between the bumps and the electrodes. Here, the conductive adhesive layer is formed to a thickness larger than double the average particle diameter of the conductive particles. Also, the nonconductive adhesive layer is formed to a thickness of ½–⅔ of the height of the bumps and may be formed to a thickness equal to or larger than the thickness of the conductive adhesive layer.

Conductive particles contained in the conductive adhesive layer, for example, may be formed of a metal powder or a complex which is formed by coating a polymer bead with a metal, such as nickel (Ni) or gold (Au), to a thickness of 1.5 μm or less. It is preferable that content of the conductive particles in the conductive adhesive layer is minimum so that desired electrical resistance can be obtained after the drive IC is connected to the substrate. For example, in case where an integrated circuit (IC) is connected to a glass substrate, on which electrodes each having a width of 30 μm are formed to a pitch of 50 μm, using the anisotropic conductive adhesive according to the present invention, when particles, which are made of polymer particles coated with a metal and each have an average particle diameter of about 4 μm, are used as conductive particles, the conductive particles have to be dispersed throughout the conductive adhesive layer at a density dispersion of about 20–50 thousand/mm$^2$, preferably about 30 thousand/mm$^2$, in order to obtain stable electrical conductivity.

Also, in order to prevent short-circuiting among a plurality of conductive particles in the conductive adhesive layer, the conductive adhesive layer may contain nonconductive particles each having an average particle diameter of ½ or less of the average particle diameter of the conductive particles, preferably about ½–1/10 of the average particle diameter of the conductive particles, and most preferably having an average particle diameter of ⅕ of the average particle diameter of the conductive particles.

The nonconductive particles are formed of a material which has a glass transition temperature that is higher than a heating temperature in a bonding process so as to withstand heat and pressure applied in the bonding process and has a hardness and elasticity so that the nonconductive particles are not broken by the pressure during the bonding process. It is preferable that the nonconductive particles are formed of polymer, such as Teflon, polyethylene, or the like, or of ceramic, such as alumina, silica, glass, silicon carbide, or the like.

Since the nonconductive particles have to be positioned among the conductive particles so as to prevent short-circuiting among the conductive particles, the nonconductive particles have to be contained in the conductive adhesive layer at a higher density distribution than the conductive particles. In other words, in the conductive adhesive layer, the number of nonconductive particles has to be larger than the number of conductive particles. The number of nonconductive particles depends on content of the conductive particles. Preferably, the number of nonconductive particles is more than two times the total number of conductive particles, most preferably three–six times. In other words, in the conductive adhesive layer, the density dispersion of the nonconductive particles has to be more than two–six times the density dispersion of the conductive particles. The nonconductive adhesive layer may be formed to a thickness equal to or thicker than the thickness of the conductive adhesive layer.

The anisotropic conductive adhesive according to the present invention may have a two-layered structure which includes a conductive adhesive layer containing conductive particles and one nonconductive adhesive layer formed on one surface of the conductive adhesive layer or may have a triple-layered structure which includes a conductive adhesive layer containing conductive particles and two nonconductive adhesive layers to cover both surfaces of the conductive adhesive layer. The anisotropic conductive adhesive of the two-layered structure may be suitably used to mount a drive IC on a glass substrate, on which indium tin oxide (ITO) electrodes are formed, by a chip-on-glass (COG) method. Also, the anisotropic conductive adhesive of the triple-layered structure, for example, may be suitably used to mount a drive IC on a substrate, which is formed of a flexible film such as a polyimide film and on which metal electrodes are formed, by a chip-on-film (COF) method.

Figure 2A:
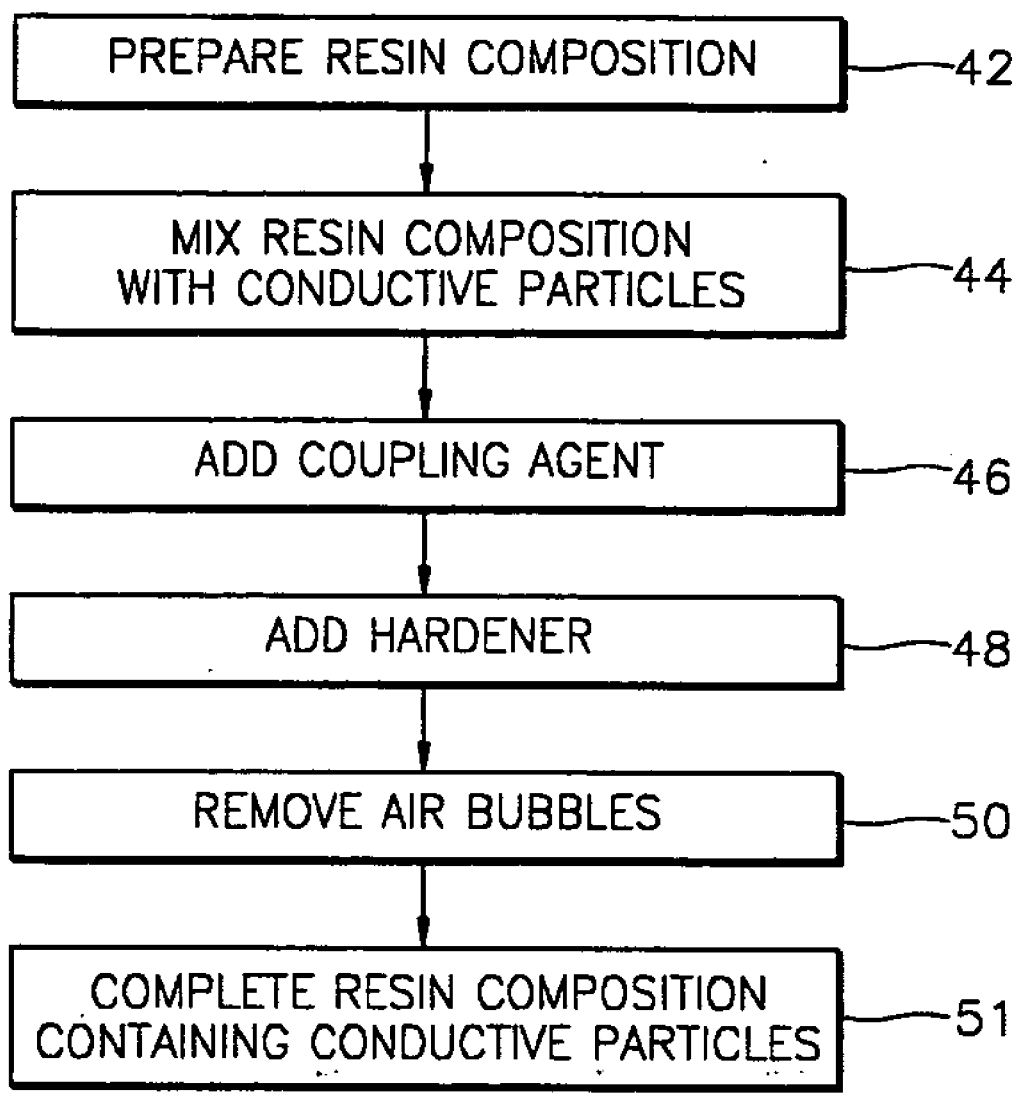
FIG. 2A is a flowchart explaining an embodiment of a method of manufacturing a resin composition which can be used for forming a conductive adhesive layer constituting an anisotropic conductive adhesive according to the present invention.

FIG. 2A is a flowchart explaining an embodiment of a method of manufacturing a resin composition which can be used for forming a conductive adhesive layer constituting an anisotropic conductive adhesive according to the present invention. In this embodiment, a method of forming a resin composition containing conductive particles to form a conductive adhesive layer will be described.

Referring to FIG. 2A, in step 42, a resin composition, which is used as a base resin necessary for forming a conductive adhesive layer constituting the anisotropic conductive adhesive according to the present invention, is prepared. The base resin may be formed of a resin composition in which solid epoxy (bisphenol-A) resin, a liquid epoxy (bisphenol-F) resin, and a phenoxy resin are mixed at a mass ratio of 1:1–5:1–5. Here, the resin composition is mixed with a solvent. For example, methylethylketone is used as a solvent for the solid epoxy resin, and toluene is used as a solvent for the liquid epoxy resin.

Preferably, with respect to the total weight of the resin composition, the resin composition is composed of 10% by weight bisphenol-A solid epoxy resin, 13% by weight bisphenol-F liquid epoxy resin, and 23% by weight phenoxy resin. The resin composition is melted in and mixed with a solvent containing methylethylketone and toluene of a volumetric ratio of 1:3 at room temperature for three or more hours.

In step 44, conductive particles are added to the resin composition obtained in step 42, and then the conductive particles are mechanically mixed with the resin composition in a chamber. The conductive particles may be formed of, for example, metal powder or a complex which is formed by coating a polymer bead made of polystyrene with a metal, such as Ni or Au, to a thickness of 1.5 μm or less. The conductive particles each have an average particle diameter of ½ or less of the width of the gaps between bumps or electrodes to be connected, preferably, an average particle diameter of ⅓ or less of the width of the gaps between bumps or electrodes. Also, content of the conductive particles is minimum so as to obtain desired electrical resistance after connecting the bumps to the electrodes. In order to obtain stable electrical conductivity, conductive particles each having an average particle diameter of about 4 μm have to be contained in the resin composition at a density dispersion of about 20–50 thousand/mm$^2$, preferably, about 30 thousand/mm$^2$.

In step 46, a coupling agent is added to the mixture obtained in step 44. A variety of silane derivatives such as 3-glycidyloxypropyltrimethoxysilane, 3-glycidyloxypropylmethyldiethoxysilane, or the like may be used as the coupling agent. A coupling agent of about 2–4% by weight of the total weight of the resin composition is mixed with the mixture.

Next, in step 48, a hardener is added to the resultant material. The hardener may be an imidazole derivative such as 2-methylimidazole, 2-ethylimidazole, 2-phenylimidazole, 1-cyanoethyl-2-methylimidazole, or the like, an amide derivative such as dicyandiamide or the like, an amine derivative, an acid anhydride, a phenol derivative, or the like. The hardener may be present in the amount of about 20–50% by weight of the total weight of the epoxy resin. The hardener is added to the resultant material and then mechanically stirred for 0.5–3 hours.

The mixture obtained by performing steps 42, 44, 46, and 48 may contain air particles created during the mixing processes. In step 50, air bubbles created by the air particles contained in the mixture are removed. If steps 42, 44, 46, and 48 are performed in a vacuum atmosphere, step 50 for removing the air bubbles may be omitted. However, in most cases, it is better for an air bubble inspection to be basically carried out.

In step 51, the resin composition containing conductive particles is completed through the above-described steps.

Figure 2B:
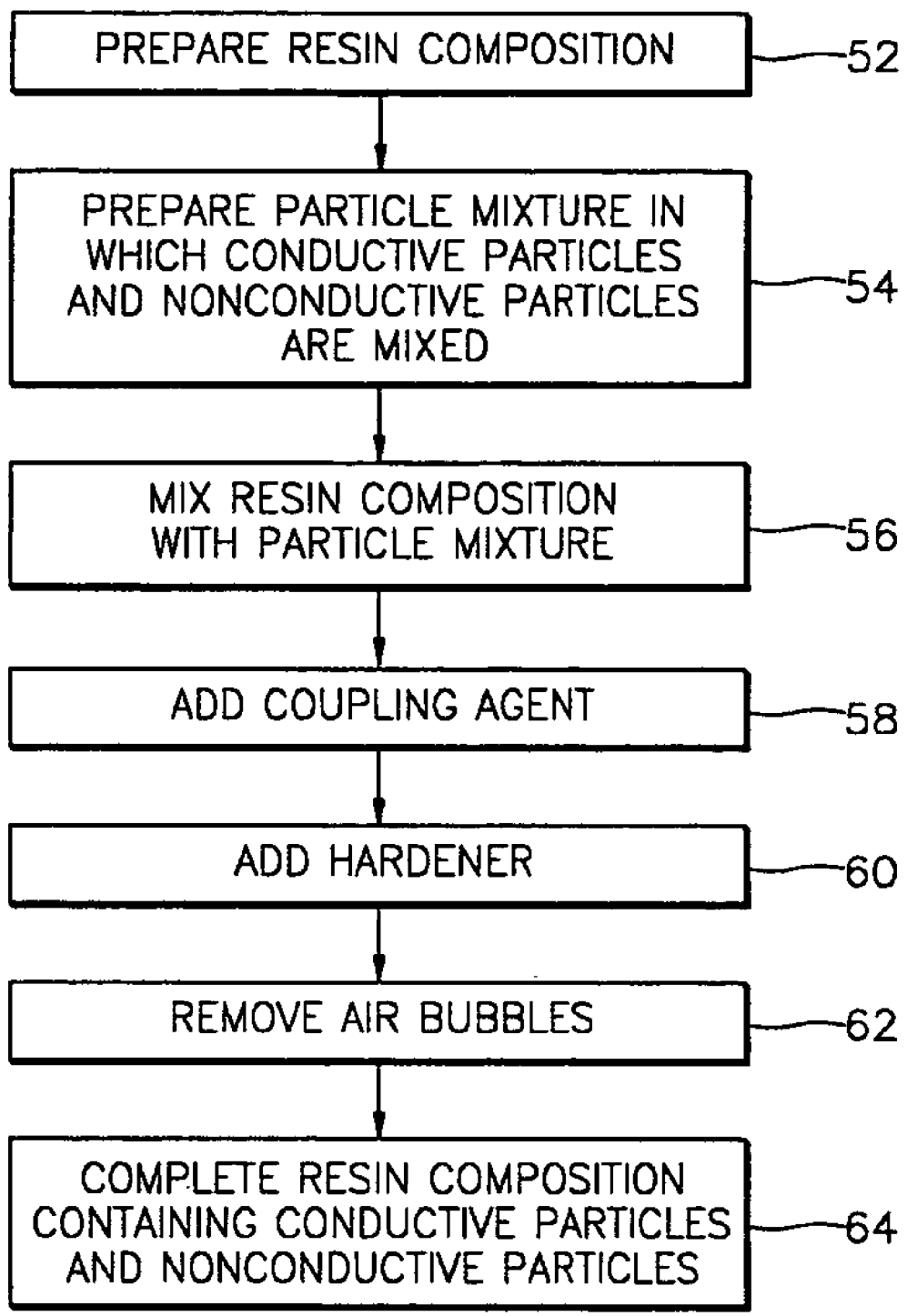
FIG. 2B is a flowchart explaining another embodiment of the method of manufacturing a resin composition which can be used for forming a conductive adhesive layer constituting an anisotropic conductive adhesive according to the present invention.

FIG. 2B is a flowchart explaining another embodiment of the method of manufacturing a resin composition which can be used for forming a conductive adhesive layer constituting an anisotropic conductive adhesive according to the present invention. In this embodiment, a method of forming a resin composition containing conductive particles and nonconductive particles to form a conductive adhesive layer will be described.

Referring to FIG. 2B, in step 52, a resin composition, which is used as base resin necessary for forming a conductive adhesive layer constituting the anisotropic conductive adhesive according to the present invention, is prepared. The base resin may be obtained by the same method as the method described in step 42 of FIG. 2A.

In step 54, a particle mixture composed of conductive particles and nonconductive particles is prepared. The conductive particles may be the conductive particles described in step 44 of FIG. 2A. Preferably, the conductive particles are polymer particles, which are coated with a metal, each have an average particle diameter of about 4 μm. Also, it is preferable that the nonconductive particles are formed of a polymer, such as Teflon, polyethylene, or the like, or of ceramic, such as alumina, silica, glass, silicon carbide, or the like. The nonconductive particles each have a particle diameter of ½–1/10 of the average particle diameter of the conductive particles, preferably, an average particle diameter of about ⅕ of the average particle diameter of the conductive particles. In the conductive adhesive layer, the number of nonconductive particles depends on the number of conductive particles and is adjusted to be more than two times the number of conductive particles, preferably, 3–6 times the number of conductive particles.

In step 56, the particle mixture obtained under the above-described conditions is mechanically mixed with the resin composition obtained in step 52.

In step 58, a coupling agent is added to the mixture obtained in step 56. In step 60, a hardener is added to the resultant material obtained in step 58, and in step 62, air bubbles are removed. As a result, in step 64, a resin composition containing conductive particles and nonconductive particles is completed.

The resin composition obtained in step 42 of FIG. 2A or step 52 of FIG. 2B may be used as a resin composition for forming the nonconductive adhesive layer constituting the anisotropic conductive adhesive according to the present invention.

Figure 3A:
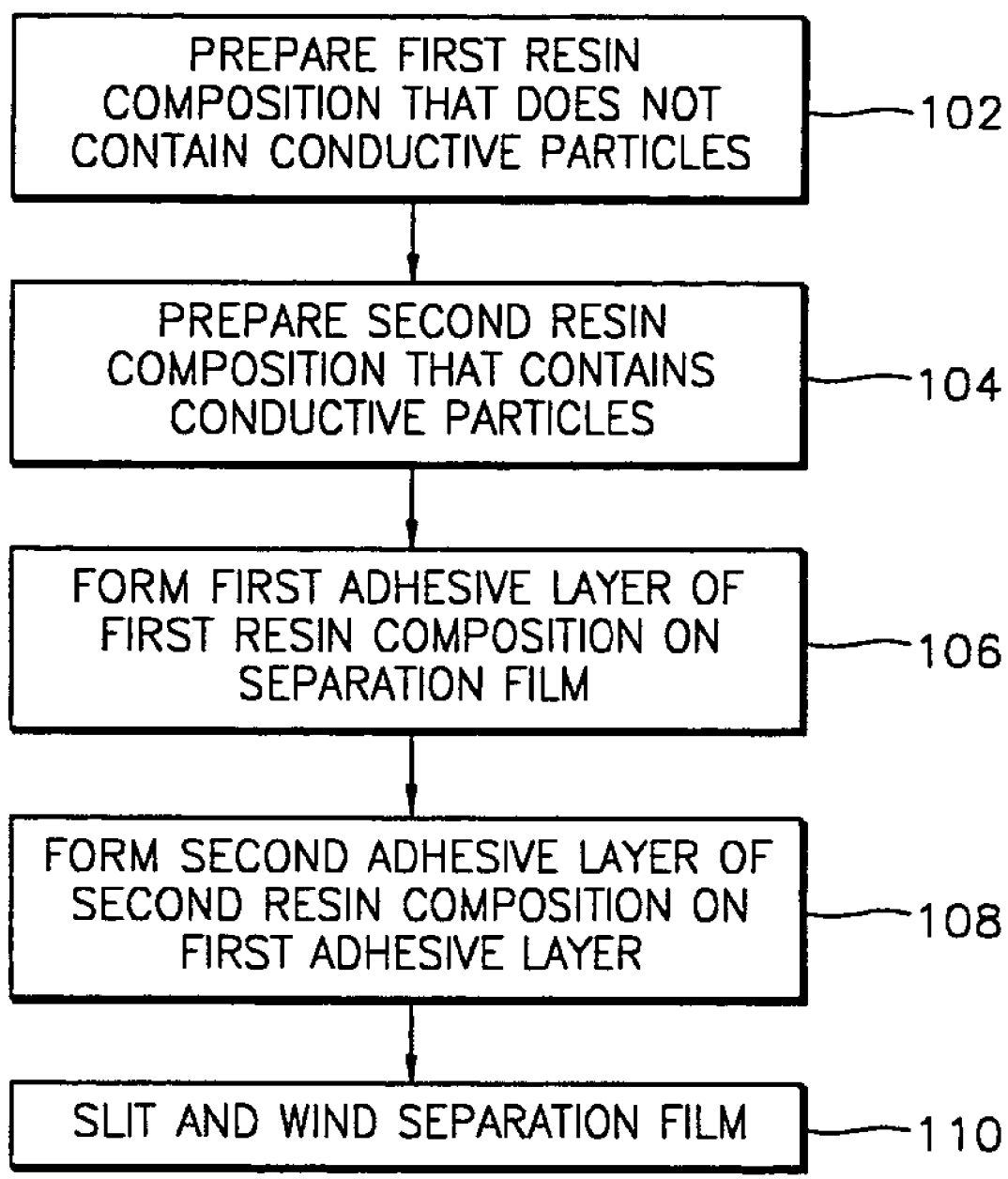
FIGS. 3A through 3C are a flowchart and cross-sectional views explaining a method of manufacturing an anisotropic conductive adhesive according to a first embodiment of the present invention.
Figure 3B:
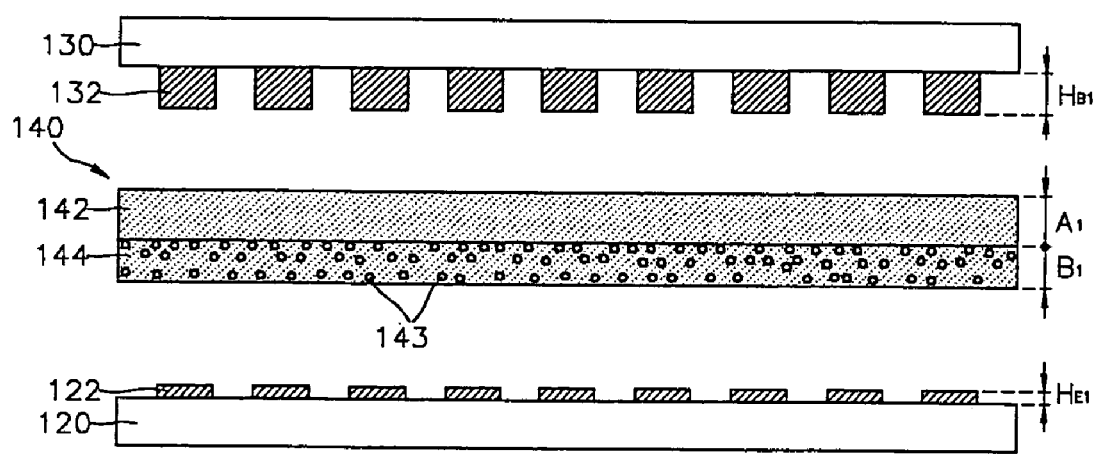

FIGS. 3A and 3B are a flowchart and a cross-sectional view explaining a method of manufacturing an anisotropic conductive adhesive 140 according to a first embodiment of the present invention. In FIGS. 3A and 3B, a method of manufacturing the anisotropic conductive adhesive 140 which can be used to connect an IC 130, on which a plurality of bumps 132 are formed, to a glass substrate 120, on which a plurality of ITO electrodes 122 are formed to a fine pitch, by a COG method will be described. In general, the ITO electrodes 122 on the glass substrate 120 each have a height of about 2 μm, which is less than the average particle diameter (in general about 3–5 μm) of conductive particles 143. Thus, in this embodiment, a method of manufacturing the anisotropic conductive adhesive 140 of a two-layered structure, which has one surface facing the IC 130 on which a nonconductive adhesive layer is formed and the other surface facing the glass substrate 120 on which a nonconductive adhesive layer is not formed, will be described.

Referring to FIG. 3A and 3B, first, in steps 102 and 104, a nonconductive first resin composition that does not contain conductive particles and a second resin composition that contains the conductive particles 143 are prepared. The nonconductive first resin composition may be obtained by the method described in step 42 of FIG. 2A and the second resin composition may be obtained by the method described in step 44 of FIG. 2A.

In step 106, a nonconductive first adhesive layer 142 is formed of the nonconductive first resin composition on a separation film (not shown). For example, for this, a separation film, which is formed of polyethyleneterephthalate (PET) to a thickness of about 10–50 μm, is coated with the nonconductive first resin composition to a thickness of about 10–30 μm and then dried at a temperature of 70–80° C. for about 0.5–2 minutes. The first adhesive layer 142 has a thickness $A_1$, which is more than ½ but less than ⅔ of the height $H_{B1}$ of bumps 132 which are formed on the IC 130 to be mounted. Preferably, the thickness $A_1$ of the first adhesive layer 142 is smaller than the height $H_{B1}$ of the bumps 132.

Next, in step 108, a second adhesive layer 142 is formed of the second resin composition containing the conductive particles 143 on the nonconductive first adhesive layer 142. For this, the nonconductive first adhesive layer 142 is coated with the second resin composition to a thickness of about 15 μm or less and then dried. Here, in order to stably connect the IC 130 to the glass substrate 120 in a compression process, it is preferable that the thickness $B_1$ of the second adhesive layer 142 is at least more than two times the average particle diameter of the conductive particles 143. Also, it is preferable that the thickness of $A_1$ of the nonconductive first adhesive layer 142 is greater than the thickness $B_1$ of the second adhesive layer 144.

Thereafter, in step 110, the separation film, on which the first and second adhesive layers 142 and 144 are formed, is slit in the shape of a tape having a width of 1.5–5 mm and wound in the shape of a reel tape to a desired length, preferably, a length of 50–100 m, thereby completing the anisotropic conductive adhesive 140 in the shape of a film.

Figure 3C:
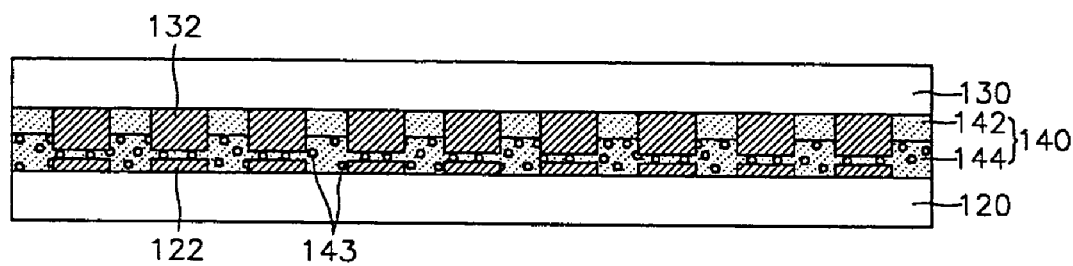

FIG. 3C is a cross-sectional view showing the resultant structure in which the IC 130 is adhered to the glass substrate 120 by using the anisotropic conductive adhesive 140 having the two-layered structure, which is manufactured by the method described with reference to FIGS. 3A and 3B.

As seen in FIG. 3C, gaps between the bumps 132 formed on the IC 130 are filled with the nonconductive first adhesive layer 142 constituting the anisotropic conductive adhesive 140 of the two-layered structure according to the present invention. Thus, since the number of conductive particles 143 in the second adhesive layer 144 flowing into the gaps between the bumps 132 is reduced, the conductive particles 143 can fully contribute to the electrical connection between the electrodes 122 and the bumps 132, thereby obtaining stable electrical conductivity. In addition, the adhesive strength of the anisotropic conductive adhesive 140 can be increased more by the first adhesive layer 142 which fills the gaps between the bumps 132.

Also, an industrial applicable anisotropic conductive adhesive is standardized. Thus, the thickness of the second adhesive layer 144 can be reduced by introducing the nonconductive first adhesive layer 142. As a result, content of the conductive particles 143 contained in the anisotropic conductive adhesive 140 can be reduced. Considering the high weight of the conductive particles 143 affecting the cost of the anisotropic conductive adhesive 140, the anistotropic conductive adhesive 140 having the above-described structure according to the present invention is very advantageous to reducing the costs.

Figure 4A:
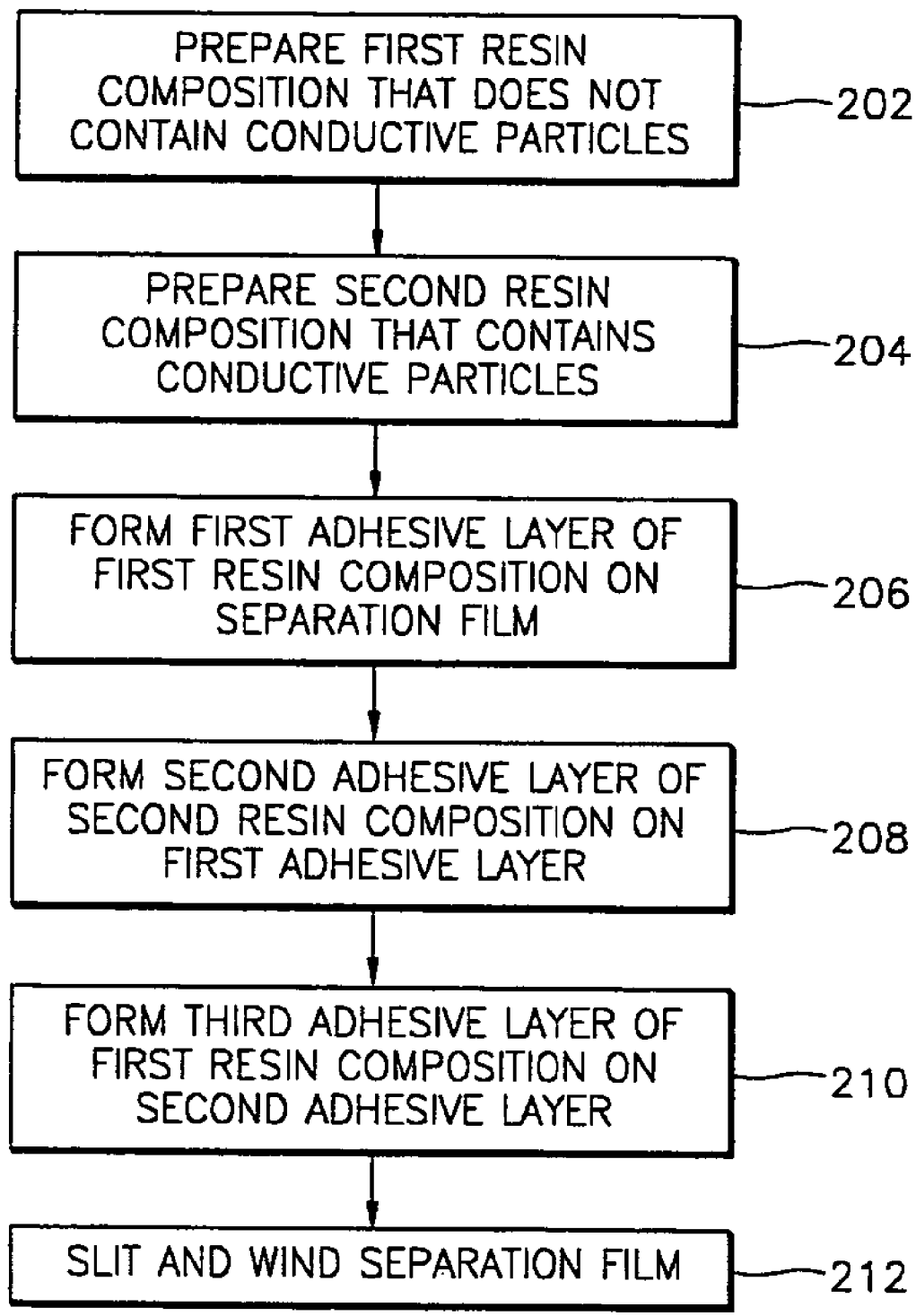
FIGS. 4A through 4C are a flowchart and cross-sectional views explaining a method of manufacturing an anisotropic conductive adhesive according to a second embodiment of the present invention.
Figure 4B:
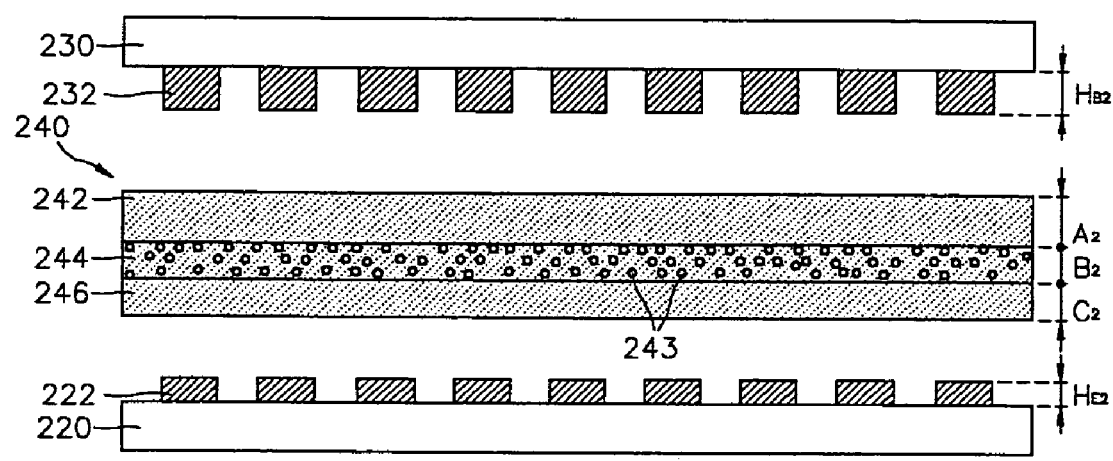

FIGS. 4A and 4B are respectively a flowchart and a cross-sectional view explaining a method of manufacturing an anisotropic conductive adhesive 240 according to a second embodiment of the present invention. In FIGS. 4A and 4B, a method of manufacturing the anisotropic conductive adhesive 240 which can be used to connect an IC 230, on which bumps 232 are formed, to a substrate 220, which is made of a flexible film, e.g., a polyimide film, and on which a plurality of metal electrodes 222 made of Cu or Al are formed to a fine pitch, by a COF method will be described. In general, the metal electrodes 222 on the substrate 220 made of the flexible film each have a height $H_{E2}$ of no greater than about 15 μm more than the height of the ITO electrodes formed on a glass substrate. Thus, in this embodiment, there will be described a method of manufacturing the anisotropic conductive adhesive 240 of a triple-layered structure which has one surface facing the IC 230 on which a nonconductive adhesive layer is formed and the other surface facing the substrate 220 made of the flexible film on which a nonconductive adhesive layer is formed.

Referring to FIGS. 4A and 4B, in steps 202 and 204, a nonconductive first resin composition that does not contain conductive particles and a second resin composition that contains conductive particles 243 are prepared. The nonconductive first resin composition may be obtained by the method described in step 42 of FIG. 2A, and the second resin composition may be obtained by the method described in step 44 of FIG. 2A.

In step 206, a nonconductive first adhesive layer 242 is formed of the nonconductive first resin composition on a separation film (not shown). For detailed descriptions of forming the nonconductive first adhesive layer 242, refer to step 106 described with reference to FIG. 3A. The nonconductive first adhesive layer 242 has a thickness $A_2$ of ½–⅔ of the height $H_{B2}$ of the bumps 232 formed on the IC 230 to be mounted. Preferably, the thickness $A_2$ of the nonconductive first adhesive layer 242 is less than the height $H_{B2}$ of the bumps 232.

Next, in step 208, a second adhesive layer 244 is formed of the second resin composition containing the conductive particles 243 on the nonconductive first adhesive layer 242. For detailed descriptions of forming the second adhesive layer 244, refer to step 108 described with reference to FIG. 3A. Here, it is preferable that the thickness $A_2$ of the nonconductive first adhesive layer 242 is greater than the thickness $B_2$ of the second adhesive layer 244.

Thereafter, in step 210, a third adhesive layer 246 that does not contain conductive particles is formed on the second adhesive layer 244. For this, a surface of the second adhesive layer 244 opposite to a surface on which the nonconductive first adhesive layer 242 is formed is coated with the nonconductive first resin composition to a thickness of about 5–25 μm, preferably, to a thickness $C_2$ of 10–15 μm, and then dried. As a result, both surfaces of the second adhesive layer 244 are respectively covered with the nonconductive first adhesive layer 242 and the third adhesive layer 246. In general, since the height $H_{B2}$ of the bumps 232 is greater than the height $H_{E2}$ of the metal electrodes 222, it is preferable that the thickness $A_2$ of the nonconductive first adhesive layer 242 be thicker than the thickness $C_2$ of the third adhesive layer 246.

In step 212, the separation film, on which the nonconductive first adhesive layer 242, the second adhesive layer 244, and the third adhesive layer 246 are formed, is slit in the shape of a tape having a width of 1.5–5 mm and wound in the shape of a reel tape to a desired length, preferably, 50–100 m, thereby completing the anisotropic conductive adhesive 240 in the shape of a film.

Figure 4C:
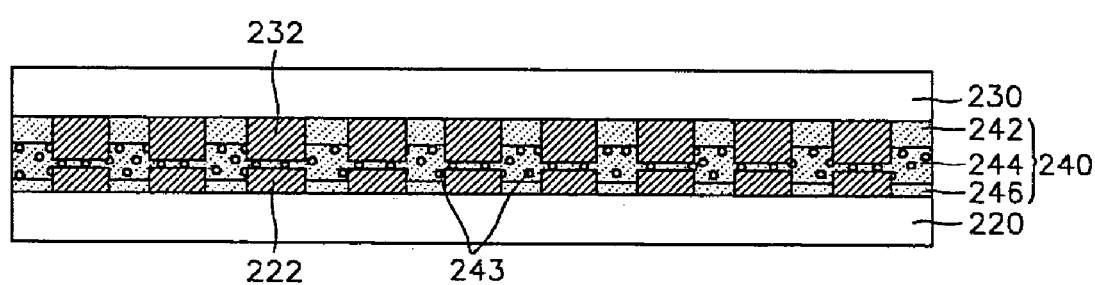

FIG. 4C is a cross-sectional view showing the resultant structure in which the IC 230 is adhered to the substrate 220 made of the flexible film by using the anisotropic conductive adhesive 240 of the triple-layered structure which is manufactured by the method described with reference to FIGS. 4A and 4B.

As seen in FIG. 4C, gaps between the bumps 232 on the IC 230 and gaps between the metal electrodes 222 on the substrate 220 are respectively filled with the nonconductive first adhesive layer 242 and the third adhesive layer 246 constituting the anisotropic conductive adhesive 240 having the triple-layered structure according to the present invention. Thus, since the number of conductive particles 243 in the second adhesive layer 244 flowing into the gaps between the bumps 232 or between the metal electrodes 222 is reduced, the conductive particles 243 can fully contribute to the electrical connection between the metal electrodes 222 and the bumps 232, thereby obtaining stable electrical conductivity. Also, the adhesive strength of the anisotropic conductive adhesive 240 can be increased more by the nonconductive first adhesive layer 242 and the third adhesive layer 246 which fill the gaps between the bumps 232 and the gaps between the metal electrodes 222, respectively.

In addition, the thickness of the second adhesive layer 244 can be reduced by introducing the nonconductive first adhesive layer 242 and the third adhesive layer 246. As a result, the costs for manufacturing the anisotropic conductive adhesive 240 can be reduced with a reduction in content of the conductive particles 243 contained in the anisotropic conductive adhesive 240.

Figure 5A:
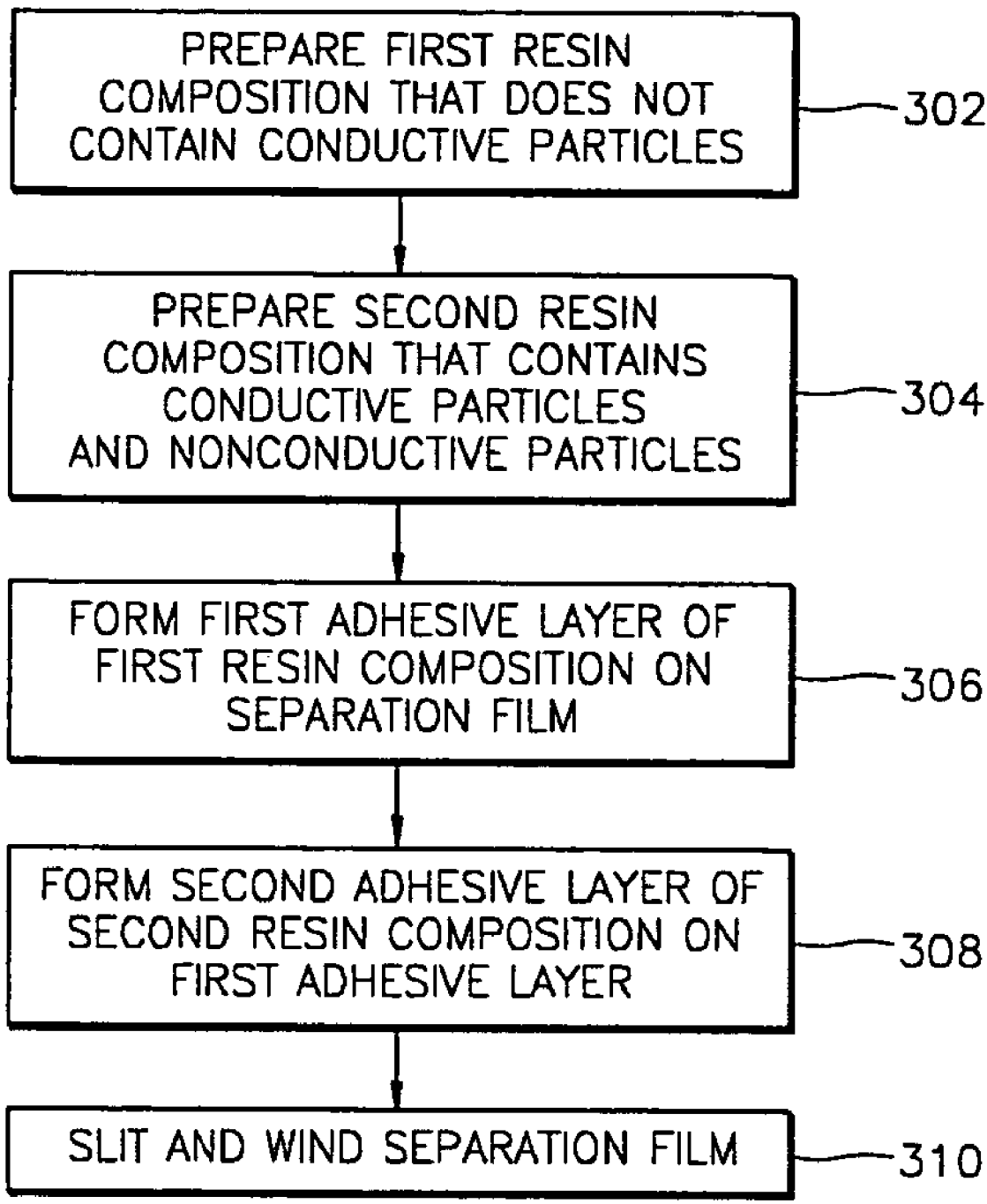
FIGS. 5A through 5C are a flowchart and cross-sectional views explaining a method of manufacturing an anisotropic conductive adhesive according to a third embodiment of the present invention.
Figure 5B:
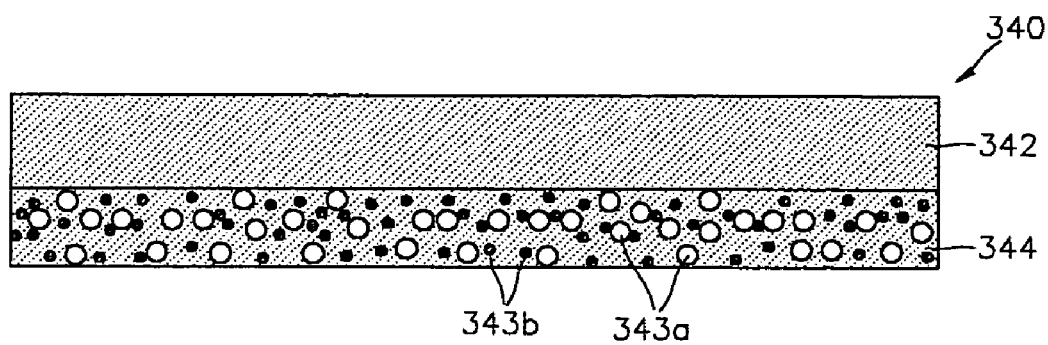
Figure 5C:
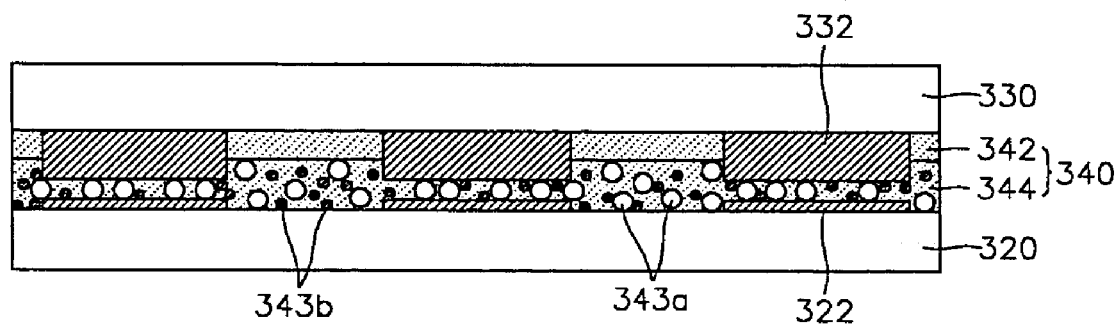

FIGS. 5A through 5C are a flowchart and cross-sectional views explaining a method of manufacturing an anisotropic conductive adhesive 340 according to a third embodiment of the present invention. In this embodiment, a method of manufacturing the anisotropic conductive adhesive 340 which can be used to connect an IC 330, on which bumps 332 are formed, to a glass substrate 320, on which a plurality of ITO electrodes 222 are formed to a fine pitch, by a COG method will be described. In this embodiment, as in the first embodiment, a method of manufacturing the anisotropic conductive adhesive 340 of a two-layered structure which has one surface facing the IC 330 on which a nonconductive adhesive layer is formed and the other surface facing the glass substrate 320 on which a nonconductive adhesive layer is not formed will be described.

Referring to FIGS. 5A through 5C, in steps 302 and 304, a nonconductive first resin composition that does not contain conductive particles and a second resin composition that contains conductive particles 343a and nonconductive particles 343b are prepared. The nonconductive first resin composition may be obtained by the method described in step 52 of 2B, and the second resin composition may be obtained by the method described in step 54 of FIG. 2B.

Here, the nonconductive particles 343b are added in order to prevent short-circuiting among the conductive particles 343a, and descriptions of this adding process are identical to previous descriptions.

In step 306, a nonconductive first adhesive layer 343 is formed of the nonconductive first resin composition on a separation film (not shown). For example, for this, a separation film made of PET is coated with the nonconductive first resin composition to a thickness of about 10–30 µm and then dried at a temperature of about 70–80° C. for about 0.5–2 minutes. The nonconductive first adhesive layer 342 has a thickness of ½–⅔ of a height of the bumps 332 on the IC 330 to be mounted. Preferably, the thickness of the nonconductive first adhesive layer 342 is less than the height of the bumps 332.

Next, in step 308, a second adhesive layer 344 is formed of the second resin composition containing the conductive particles 343a and the nonconductive particles 343b, on the nonconductive first adhesive layer 342. Here, in order to stably connect the IC 330 to the glass substrate 320 in a compression process, it is preferable that the thickness of the second adhesive layer 344 is at least more than two times the average particle diameter of the conductive particles 343a. Also, it is preferable that the thickness of the nonconductive first adhesive layer 342 is larger than the thickness of the second adhesive layer 344.

Thereafter, in step 310, the separation film, on which the nonconductive first adhesive layer 342 and the second adhesive layer 344 are formed, is slit in the shape of a tape and wound in the shape of a reel tape, thereby completing the anisotropic conductive adhesive 340.

In the anisotropic conductive adhesive 340 of the two-layered structure according to the third embodiment, the second resin adhesive 344 contains the conductive particles 343a and the nonconductive particles 343b. Thus, the anisotropic conductive adhesive 340 can achieve effects obtainable from the anisotropic conductive adhesive 140 according to the first embodiment described with reference FIGS. 3A through 3C. Also, since the nonconductive particles 343b are positioned among the conductive particles 343a, short-circuiting among the conductive particles 343a can be effectively prevented.

Figure 6A:
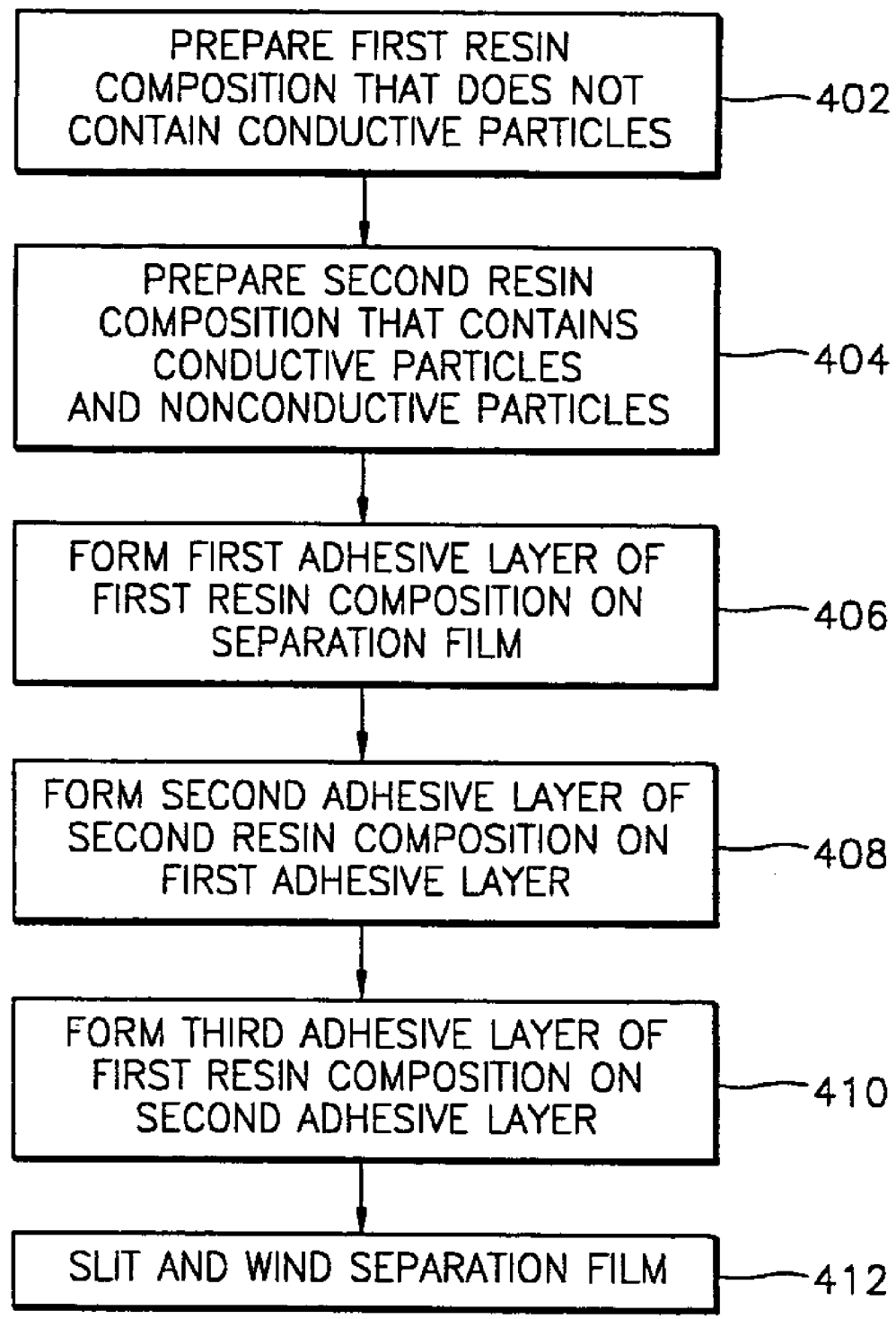
FIGS. 6A through 6C are a flowchart and cross-sectional views explaining a method of manufacturing an anisotropic conductive adhesive according to a fourth embodiment of the present invention.
Figure 6B:
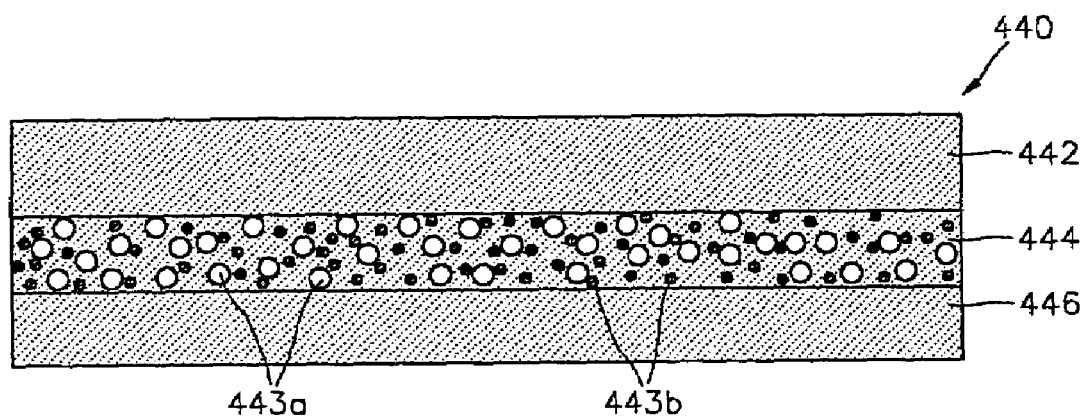
Figure 6C:
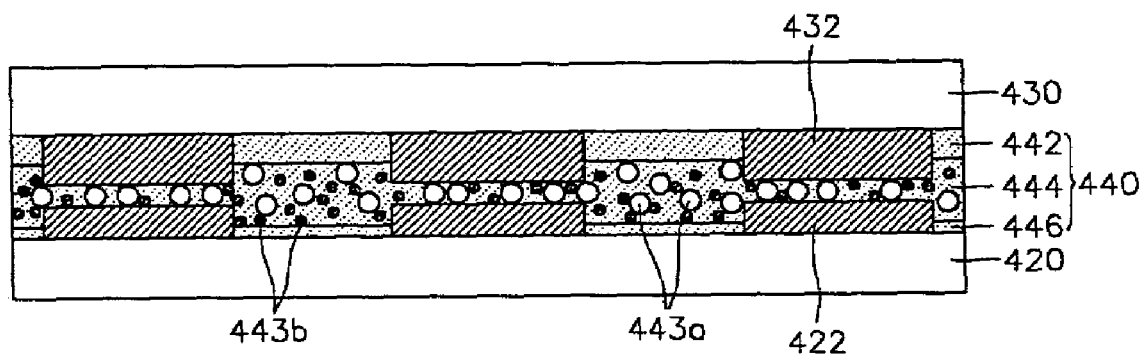

FIGS. 6A through 6C are a flowchart and cross-sectional views explaining a method of manufacturing an anisotropic conductive adhesive 440 according to a fourth embodiment of the present invention. In this embodiment, a method of manufacturing the anisotropic conductive adhesive 440 which can be used to connect an IC 430, on which bumps 432 are formed, to a substrate 420, which is made of a flexible film, e.g., a polyimide film, and on which a plurality of metal electrodes 422 made of Cu or Al are formed to a fine pitch, by the COF method will be described. In this embodiment, described will be a method of manufacturing the anisotropic conductive adhesive 440 of a triple-layered structure which has one surface facing the IC 430 on which a nonconductive adhesive layer is formed and the other surface facing the substrate 420 made of the flexible film on which a nonconductive adhesive layer is formed.

Referring to FIGS. 6A through 6C, in steps 402 and 404, a nonconductive first resin composition that does not contain conductive particles and a second resin composition that contains conductive particles 443a and nonconductive particles 443b are prepared. The nonconductive first resin composition may be obtained by the method described in step 52 of FIG. 2B, and the second resin composition may be obtained by the method described in step 54 of FIG. 2B.

Next, in step 406, a nonconductive first adhesive layer 442 is formed on a separation film (not shown) of the nonconductive first resin composition. For detailed descriptions for forming the nonconductive first adhesive layer 442, refer to step 106 described with reference to FIG. 3A. The first adhesive layer 442 has a thickness of ½–⅔ of the height of bumps 432 formed on the IC 430 to be mounted. Preferably, the thickness of the first adhesive layer 442 is less than the height of the bumps 432.

Next, in step 408, a second adhesive layer 444 is formed of the second resin composition containing the conductive particles 443a and the nonconductive particles 443b, on the nonconductive first adhesive layer 442. For detailed descriptions of forming the second adhesive layer 444, refer to step 308 described with reference to FIG. 5A. Here, it is preferable that the thickness of the nonconductive first adhesive layer 442 is greater than the thickness of the second adhesive layer 444.

In step 410, a third adhesive layer 446 that does not contain conductive particles is formed on the second adhesive layer 444. For this, one surface of the second adhesive layer 444 opposite to the other surface of the second adhesive layer 444 on which the nonconductive first adhesive layer 442 is formed is coated with the nonconductive first composition to a thickness of about 5–25 µm, preferably, a thickness of 10–15 µm, and then dried. As a result, both surfaces of the second adhesive layer 444 are respectively covered with the nonconductive first adhesive layer 442 and the third adhesive layer 446. Here, it is preferable that the thickness of the nonconductive first adhesive layer 442 is greater than the thickness of the third adhesive layer 446.

Thereafter, in step 412, the separation film on which the first, second, and third adhesive layers 442, 444, and 446 are formed is slit in the shape of a tape and wound in the shape of a reel tape, thereby completing the anisotropic conductive adhesive 440 having the shape of a film.

In the anisotropic conductive adhesive 440 of the triple-layered structure according to the fourth embodiment, the second adhesive layer 444 contains the conductive particles 443a and the nonconductive particles 443b. Thus, the anisotropic conductive adhesive 440 can achieve effects obtainable from the anisotropic conductive adhesive 240 according to the second embodiment described with reference to FIGS. 4A through 4C. Also, since the nonconductive particles 443b are positioned among the conductive particles 443a, short-circuiting among the conductive particles 443 can be effectively prevented.

A method of connecting an IC to a glass substrate or a substrate made of a flexible film using an anisotropic conductive adhesive according to the present invention by a COG or a COF method will now be described.

First, the transparent glass substrate 120, on which the ITO electrodes 122 are spaced apart from each other, as shown in FIG. 3B, or the flexible substrate 220 made of the polyimide film on which the metal electrodes 222 are formed, as shown in FIG. 4B, are prepared. The ITO electrodes 122 on the transparent glass substrate 120 have a height of about 1 µm and a width of about 30 µm and are formed on the transparent glass substrate 120 to a pitch of about 50 µm. Thus, gaps between the electrodes 122 are respectively about 20 µm wide. Also, the metal electrodes 222 on the flexible substrate 220 each have a height of about 15 µm or less and are formed to a pitch of about 38 µm. Thus, gaps between the electrodes 222 are respectively about 10 µm wide.

A drive IC (130 or 230), on which input/output bumps (132 or 232) are formed, as shown in FIG. 3B or 4B, are prepared. The input/output bumps are composed of electroless Ni/Au plating bumps formed on a surface of an Al electrode (not shown) of the drive IC. When forming the input/output bumps, the electroless Ni/Au plating bumps are formed to replace high-priced Au bumps. For this, a zincate treatment process is performed to substitute zinc for a portion of the surface of the Al electrode of the drive IC so as to react with Ni when plating Ni. Thereafter, Ni bumps are formed on the zincate-treated Al electrode by an electroless plating method, and then the electroless Ni/Au plating bumps are formed on a surface of the resultant Ni by performing an Au plating process using the electroless plating method.

The input/output bumps each have a height of about 15–25 μm or less and are formed to a pitch identical to the pitch of electrodes on the substrate (120 or 220) to be connected.

The anisotropic conductive adhesive according to the present invention is aligned on the substrate (120 or 220) on which the electrodes (122 or 222) are formed, and then preliminarily compressed at a temperature of about 70–90° C. and a pressure of 3–10 kg$_f$/cm$^2$ by applying a pressure to the anisotropic conductive adhesive for about 3–5 seconds.

Here, as shown in FIG. 3B, in the case of the glass substrate 120 on which the ITO electrodes 122 are formed, since the height of the ITO electrodes 122 is less than the average particle diameter of conductive particles, it is not necessary to form a nonconductive adhesive layer on a surface of a conductive adhesive layer facing the glass substrate 120. Thus, the anisotropic conductive adhesive of the two-layered structure manufactured using the method described with reference to FIGS. 3A through 3C or FIGS. 5A through 5C is used. Here, the second adhesive layer (144 or 344) is aligned so as to face the substrate 120.

As shown in FIG. 4B, in the case of the flexible substrate 220 on which the metal electrodes 222 are formed, since the height of the metal electrodes 222 is relatively high, it is necessary to form a nonconductive adhesive layer on a surface of a conductive adhesive layer facing the substrate 220. Thus, the anisotropic conductive adhesive of the triple-layered manufactured using the method described with reference to FIGS. 4A through 4C or FIGS. 6A through 6C is used. Here, the third adhesive layer (246 or 446) is aligned so as to face the substrate 220.

Thereafter, a separation film is removed from the preliminarily compressed anisotropic conductive adhesive, and then the drive IC is aligned on the preliminarily compressed anisotropic conductive adhesive so that the electrodes (122 or 222) are aligned opposite to the input/output bumps.

Next, the drive IC is bonding-compressed to the aligned substrate (120 or 220) by applying a pressure of 500–1500 kg$_f$/cm$^2$ for about 5–10 seconds at a temperature of 190–220° C. After that, the compressed resultant structure is cooled on a cooling stage without applying pressure to the compressed resultant structure.

An anisotropic conductive adhesive according to the present invention has a two-layered or a triple-layered structure which includes a conductive adhesive layer that contains conductive particles, or a conductive adhesive layer that contains conductive particles and nonconductive particles, and a nonconductive adhesive layer that is formed on one surface or both surfaces of the conductive adhesive layer and does not contain conductive particles.

Accordingly, in case where an IC is connected to a substrate, on which a plurality of electrodes are formed to a fine pitch, using the anisotropic conductive adhesive according to the present invention, gaps between bumps formed on the IC or gaps between the electrodes are filled with a nonconductive adhesive layer. As a result, since the number of conductive particles in the anisotropic conductive adhesive flowing into the gaps between the bumps or the electrodes is reduced, the conductive particles can fully contribute to the electrical connection between the electrodes and the bumps, thereby obtaining stable electrical conductivity. Also, since the nonconductive adhesive layer, which fills the gaps between the bumps or electrodes, does not contain conductive particles, the adhesive strength between the substrate and the IC can be increased more. Thus, a highly reliable and stable adhesion process is possible. Furthermore, since a thickness of the conductive adhesive layer can be reduced by introducing the nonconductive adhesive layer in the anisotropic conductive adhesive, content of the conductive particles contained in the anisotropic conductive adhesive can be reduced. Thus, the costs for completing the anisotropic conductive adhesive can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An anisotropic conductive adhesive for a fine pitch which can be used to adhere an integrated circuit, on which a plurality of bumps each having a second height are formed, to a substrate, on which a plurality of electrodes each having a first height are formed keeping predetermined distances from each other, so that the integrated circuit is electrically connected to the electrodes, the anisotropic conductive adhesive comprising:

a nonconductive first adhesive layer which includes a thermosetting resin and a hardener for hardening the thermosetting resin and has a first thickness of ½–⅔ of the second height; and a second adhesive layer which includes a thermosetting resin, a hardener for hardening the thermosetting resin, and a plurality of conductive particles each having an average particle diameter of ½ or less of the width of gaps between the plurality of electrodes and a first density dispersion, has a second thickness larger than two times the average particle diameter of the conductive particles, and is formed on one surface of the nonconductive first adhesive layer.

2. The anisotropic conductive adhesive of claim 1, wherein the conductive particles are contained at the first density dispersion of 20–50 thousand/mm$^2$.

3. The anisotropic conductive adhesive of claim 1, wherein the second adhesive layer further comprises a plurality of nonconductive particles, each having an average particle diameter of ½–¹⁄₁₀ of the average particle diameter of the conductive particles, which are contained at a second density dispersion which is higher than the first density dispersion.

4. The anisotropic conductive adhesive of claim 3, wherein the second density dispersion is 2–6 times higher than the first density dispersion.

5. The anisotropic conductive adhesive of claim 1, wherein the first thickness is equal to or greater than the second thickness.

6. The anisotropic conductive adhesive of claim 1, wherein the substrate is a glass substrate having indium tin oxide electrodes.

7. The anisotropic conductive adhesive of claim 1, wherein the substrate is a flexible film having metal electrodes.

8. The anisotropic conductive adhesive of claim 1, further comprising a third nonconductive adhesive layer which includes a thermosetting resin and a hardener for hardening the thermosetting resin and is formed the other surface of the second adhesive layer opposite to a surface of the second adhesive layer on which the nonconductive first adhesive layer is formed.

9. The anisotropic conductive adhesive of claim 8, wherein the third adhesive layer has a third thickness of $\frac{1}{2}$–$\frac{3}{2}$ of the first height of the electrodes formed on the substrate.

10. The anisotropic conductive adhesive of claim 9, wherein the third thickness is less than the first thickness.

11. The anisotropic conductive adhesive of claim 8, wherein the substrate is a flexible film having metal electrodes.

* * * * *